United States Patent
Uchida et al.

(10) Patent No.: US 7,317,244 B2
(45) Date of Patent: Jan. 8, 2008

(54) SEMICONDUCTOR DEVICE AND MANUFACTURING METHOD THEREOF

(75) Inventors: Yasufumi Uchida, Tokyo (JP); Yoshimi Egawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 62 days.

(21) Appl. No.: 10/341,463

(22) Filed: Jan. 14, 2003

(65) Prior Publication Data

US 2003/0132516 A1 Jul. 17, 2003

(30) Foreign Application Priority Data

Jan. 15, 2002 (JP) .............................. 2002-006786

(51) Int. Cl.
H01L 23/02 (2006.01)
(52) U.S. Cl. ..................................................... 257/686
(58) Field of Classification Search ................ 257/781, 257/782, 686–690, 734–738, 784, 785, 780, 257/777, 695, E21.508
See application file for complete search history.

(56) References Cited

U.S. PATENT DOCUMENTS

| | | | |
|---|---|---|---|
| 6,207,476 B1* | 3/2001 | Zhao et al. ................. | 438/112 |
| 6,215,182 B1* | 4/2001 | Ozawa et al. ................ | 257/723 |
| 6,541,848 B2* | 4/2003 | Kawahara et al. ........... | 257/690 |
| 6,593,664 B2* | 7/2003 | Schober et al. .............. | 257/784 |
| 6,717,252 B2* | 4/2004 | Saeki .......................... | 257/686 |
| 2001/0002734 A1* | 6/2001 | Tandy ......................... | 257/781 |
| 2001/0017412 A1* | 8/2001 | Asazu et al. ................. | 257/737 |
| 2002/0000671 A1* | 1/2002 | Zuniga et al. ............... | 257/773 |
| 2002/0011666 A1* | 1/2002 | Tandy ......................... | 257/738 |
| 2002/0047213 A1* | 4/2002 | Komiyama et al. ......... | 257/777 |
| 2002/0056901 A1 | 5/2002 | Ono et al. | |
| 2002/0153615 A1* | 10/2002 | Komiyama et al. ......... | 257/777 |

FOREIGN PATENT DOCUMENTS

| | | |
|---|---|---|
| JP | 63-143826 | 6/1988 |
| JP | 1-298731 | 12/1989 |
| JP | 2-30154 | 1/1990 |
| JP | 2000-114452 | 4/2000 |
| JP | 2000-164623 | 6/2000 |

* cited by examiner

Primary Examiner—Ha W. Nathan
(74) Attorney, Agent, or Firm—Rabin & Berdo, PC

(57) ABSTRACT

In a semiconductor device having a semiconductor chip mounted on a printed circuit board, the semiconductor chip has a plurality of electrodes and the printed circuit board has a plurality of conductive patterns. Metallic plated layers are formed on the electrodes of the semiconductor chip. The metallic plated layers on the electrodes of the semiconductor chip are electrically connected with the conductive patterns of the printed circuit board by metallic wires.

29 Claims, 15 Drawing Sheets

SEMICONDUCTOR DEVICE AND MANUFACTURING METHOD THEREOF

BACKGROUND OF THE INVENTION

1. Field of the Invention

The present invention relates to a semiconductor device including a printed circuit board on which a semiconductor chip is mounted, and method of manufacturing it. Particularly, the present invention relates to the structure and the shape of an electrode formed on the semiconductor chip, and to a method of manufacturing a semiconductor device including such an electrode. The present application claims priority under 35 U.S.C. § 119 to Japanese Application No. 2002-6786 filed on Jan. 15, 2002, which is hereby incorporated by reference in its entirely for all purposes.

2. Description of the Related Art

In the related art, a semiconductor device which is assembled using a multi chip package is shown in FIGS. 1A and 1B. The FIG. 1A is a cross sectional view and the FIG. 1B is a plane view.

A first semiconductor chip 54 is fixed on a printed circuit board 50 by an adhesive layer 52. A second semiconductor chip 56 is fixed on the first semiconductor chip 54 by an adhesive layer 52. A plurality of electrodes 58 are respectively formed on each surface of the first and second semiconductor elements 54 and 56. A plurality of conductive patterns 60 are formed on the printed circuit board 50, and the conductive patterns 60 are respectively connected with the electrodes 58 of the first semiconductor chip 54 by metallic wires 64. Some of the electrodes 58 of the first semiconductor chip 54, to be connected with the electrodes 58 of the second semiconductor chip 56, have aurous stud bumps 66 on each of their own surfaces in order to absorb the impact generated when the metallic wire 68 is connected to the electrodes 58 of the first semiconductor chip 54. The aurous stud bump 66 is connected with the electrodes 58 of the second semiconductor chip 56 by a metallic wire 68. When the first and second semiconductor chips 54 and 56 are connected with each other through the electrodes 58, at the beginning, a metallic ball 62 which is another edge of the metallic wire 68 is connected to the electrodes 58 of the second semiconductor chip 56, and hereupon, the other edge of the metallic wire 68 is connected to the aurous stud bump 66 on the electrodes 58 of the first semiconductor chip 54. After that, the first and second semiconductor chips 54 and 56 are sealed by a molding resin 70. A plurality of the solder balls are formed on a back surface of the printed circuit board 50 as external connecting terminals.

However, in the above-mentioned semiconductor device, it is necessary that a thickness of the aurous stud bump 66, which is expensive due to the cost of material, is no less than 10 μm in order to absorb the connecting impact generated in wire-bonding between the metallic wire 68 and the electrodes 58 of the first semiconductor chip 54. Also, it takes much time to form a plurality of the aurous stud bumps 66 on the electrodes 58 because the bumps 66 on the electrodes 58 need to be formed one by one in sequence. Furthermore, it takes more areas of the electrodes 58 to form the stud bumps 66 on them.

SUMMARY OF THE INVENTION

An object of the present invention is to provide a smaller-size semiconductor device with high connecting reliability. Another object of the present invention is to provide a semiconductor device designed at lower cost.

To achieve the object, in a semiconductor device having a semiconductor chip mounted on a printed circuit board, the semiconductor chip has a plurality of electrodes and the printed circuit board has a plurality of conductive patterns. Metallic plated layers are formed on the electrodes of the semiconductor chip. The metallic plated layers on the electrodes of the semiconductor chip are electrically connected with the conductive patterns of the printed circuit board by metallic wires.

According to the present invention, a connecting impact generated when a metallic wire is connected with the electrode of the semiconductor chip can be absorbed by the metallic plated layer and a semiconductor device with high connecting reliability can be realized.

To achieve the other object, in a method of manufacturing a semiconductor device having a semiconductor chip mounted on the printed circuit board, a printed circuit board having a plurality of conductive patterns formed thereon and a semiconductor chip having a plurality of electrodes formed threreon are prepared. Metallic plated layer is formed on the electrodes in a lump by electroless plating. The semiconductor chip is mounted on the printed circuit board. And the electrodes are connected with the conductive patterns respectively by metallic wires.

According to the present invention, the overall materials cost in manufacturing the semiconductor device can be reduced.

BRIEF DESCRIPTION OF THE DRAWINGS

FIG. 1A is a cross sectional view of a semiconductor device as used by known technology.

DETAILED DESCRIPTION OF THE PREFERRED EMBODIMENTS

The present invention will be described hereinafter with references to the accompanying drawings. The drawings used for this description typically illustrate major characteristic parts in order that the present invention will be easily understood.

First Preferred Embodiment

Figure 1A:
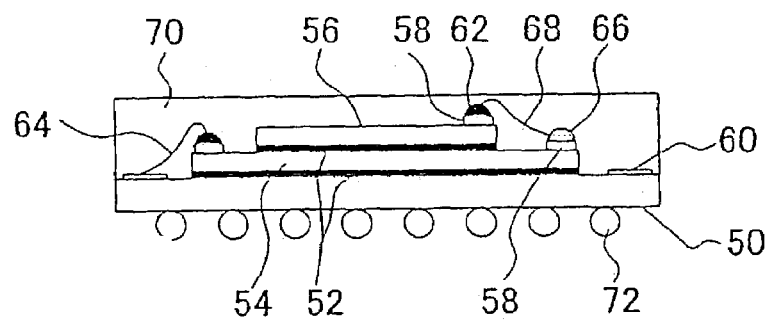
FIGS. 1A and 1B refer to a prior art.
Figure 1B:
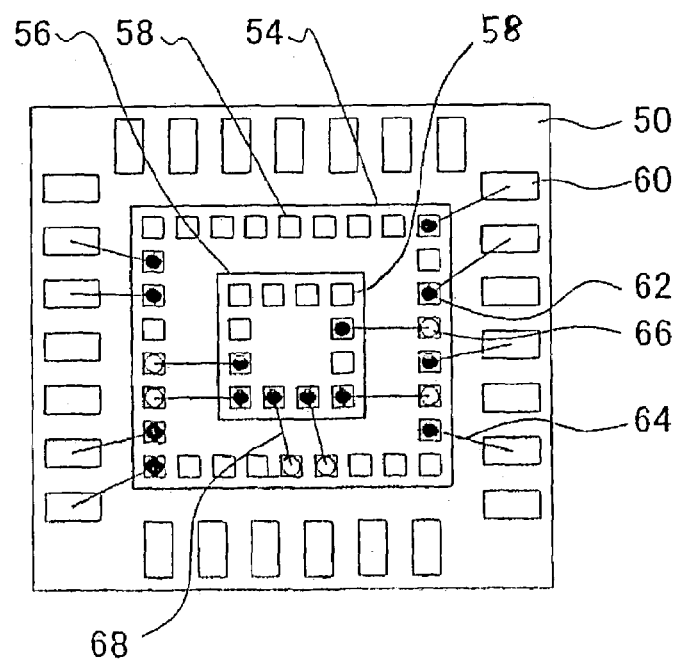
Figure 2:
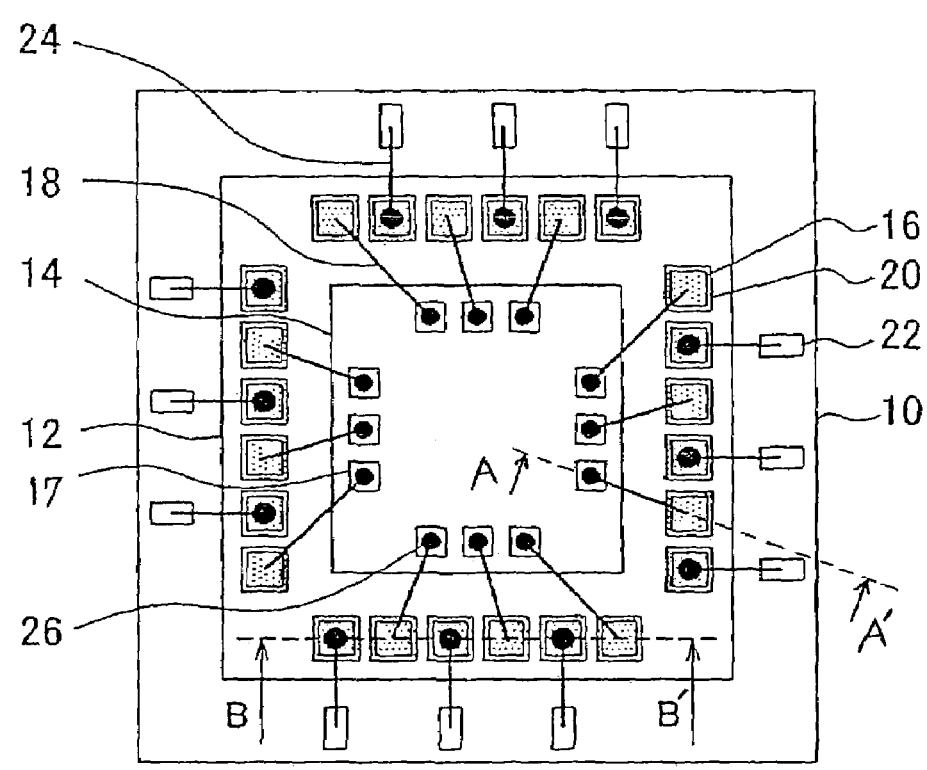
FIG. 2 is a plane view describing a semiconductor device according to a first preferred embodiment.
Figure 3A:
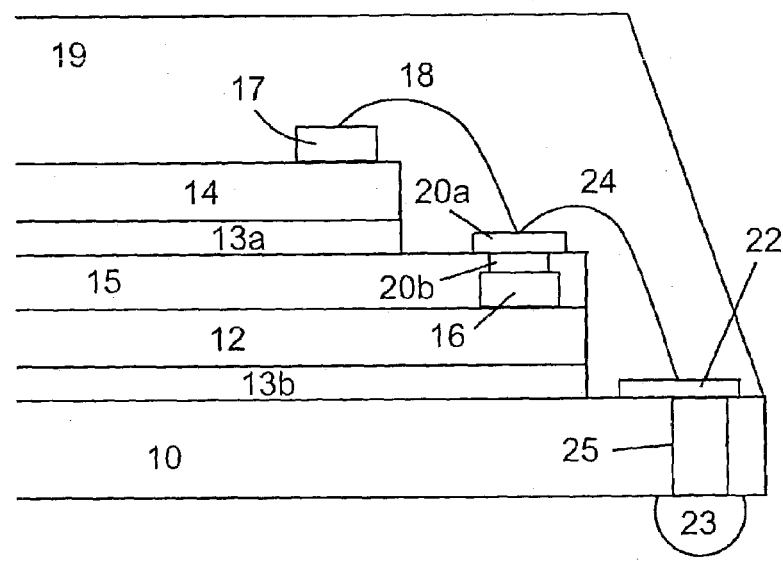
FIGS. 3A and 3B are respectively cross-sectional view at interrupted lines A-A' and B-B' of the semiconductor device in FIG. 2.
Figure 3B:
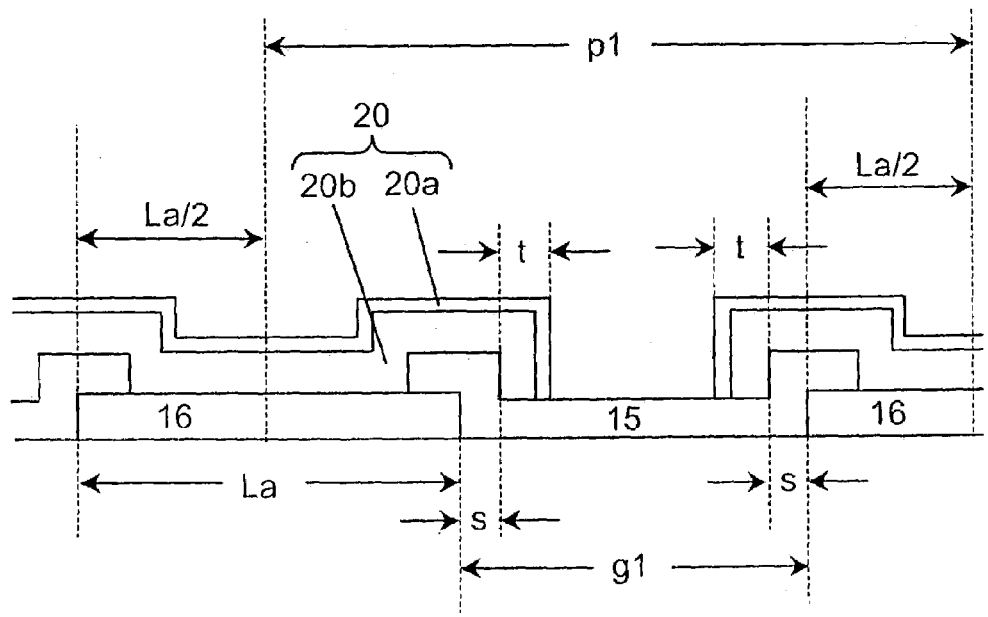

FIG. 2 is a plane view describing a semiconductor device according to a first preferred embodiment. FIGS. 3A and 3B are respectively cross-sectional view at interrupted lines A-A' and B-B' of the semiconductor device in FIG. 2.

A first semiconductor chip 12 is mounted on a main surface of a printed circuit board 10 by adhesive layer 13b. A second semiconductor chip 14 is mounted on the first semiconductor chip 12 by adhesive layer 13a. A plurality of conductive patterns 22 are formed on the main surface of the printed circuit board 10 and are disposed along the periphery of the printed circuit board 10. A plurality of solder balls 23 are formed on a back surface of the printed circuit board 10. The solder balls 23 are connected with the conductive patterns 22 via conductive material provided in through holes 25.

A plurality of first electrodes 16 are formed on a periphery of the first semiconductor chip 12. A passivation layer 15 is formed on a surface of the first semiconductor chip 12 and covers a side surface of each of the first electrodes 16. The first electrode 16 is made of aluminum, and a metallic plated layer 20 is formed so as to cover a surface of the first electrode 16. The metallic plated layer 20 on the first electrode 16 is connected with the conductive pattern 22 by a metallic wire 24. A plurality of second electrodes 17 are formed on a periphery of the second semiconductor chip 14. The second electrode 17 is also made of aluminum and is connected with the metallic plated layer 20 on the first electrode 16 of the first semiconductor element 12 by a metallic wire 18. Hereupon, the first electrode 16 connected with the conductive pattern 22 and the first electrode 16 connected with the second electrode 17 are alternately disposed along one side or the periphery of the first semiconductor chip 12 as shown in FIG. 2.

The metallic plated layer 20 comprises an upper metallic plated layer 20a and a lower metallic plated layer 20b as shown in FIG. 3A. The lower metallic plated layer 20b includes nickel and is formed on the first electrode 16 of the first semiconductor chip 12 so as to cover an upper surface of the first electrode 16. The upper metallic plated layer 20a includes aurum and is formed on the lower metallic plated layer 20b so as to cover an upper surface of the lower metallic plated layer 20b. Both the upper and lower metallic plated layers 20a and 20b are formed by electroless plating. For example, it is preferred that the thickness of the lower metallic plated layer 20b ranges approximately from 5 µm to 6 µm and the thickness of the upper metallic plated layer 20a ranges approximately from 0.05 µm to 0.1 µm. The first and second semiconductor chips 12 and 14, which are connected with each other by metallic wire 18, are sealed by a molding resin 19 on the printed circuit board 10.

The metallic wires 18 and 24 are made of gold or a gold alloy. First of all, the metallic wire 18 is flamed off by torch at a tip of the capillary, and a metallic ball 26 is formed at a tip of the metallic wire 18. The metallic wire 24 is prepared likewise. Then, the metallic ball of the metallic wire 18 is fed to the second electrode 17 of the second semiconductor chip 14 through a capillary by using ultrasonic wave and pressurization of the capillary. After one end portion of the metallic wire 18 is connected to the second electrode 17 of the second semiconductor chip 14 in this manner, another end portion of the metallic wire 18 is connected to the metallic plated layer 20 on the first electrode 16 of the first semiconductor chip 12 by moving the capillary from the second electrode 17 toward the first electrode 16 and using ultrasonic wave and pressurization of the capillary. Hereupon, since the metallic plated layer 20 (the upper and lower metallic plated layer 20a and 20b) is formed on the first electrode 16 of the first semiconductor chip 12, the connect impact, occurred when the another end portion of the metallic wire 18 is electrically connected to the first electrode 16 of the first semiconductor chip 12, is absorbed by the metallic plated layer 20.

The metallic plated layer 20 (each of the upper and lower metallic plated layers 20a and 20b) is formed by the electroless plating as stated below.

In the first place, covering oxidized layers are removed from the first electrodes 16 made of aluminum by a substitution method with zinc. By reducing nickel ion chemically and using hypophosphorous acid as a reductant, a nickel layer whose thickness ranges approximately from 5 µm-6 µm is formed on each of the first electrodes 16. Thus, the lower metallic plated layers 20b are formed on each of the first electrodes 16 in a lump by the electroless plating.

Next, aurum atoms are deposited on the nickel layer (the lower metallic plated layer 20b) by using boron-potassium hydroxide as a reductant. Since aurum atoms function as catalysts by itself, an aurum layer grows on the nickel layer. Thus, the upper metallic plated layers 20a whose thickness ranges approximately from 0.05 µm-0.1 µm are formed on each of the lower metallic plated layers 20b in a lump by the electroless plating.

The condition of the interval between two first electrodes 16 in the first preferred embodiment is stated below. FIG. 3B is a cross sectional view of the two adjacent first electrodes 16 of the first semiconductor chip 12 taken along line B-B' in FIG. 2. In this view, the passivation layer 15, the upper and lower plated layer 20a and 20b are formed on a side surface of the first electrode 16. Therefore, the two adjacent first electrodes 16 must be disposed on the first semiconductor chip 12 so that the metallic plated layers 20 on the adjacent first electrodes 16 can't contact with each other. Hereupon, the thickness of the metallic plated layer 20 is designated as "t", the thickness of the passivation layer 15 is designated as "s", and the interval between two of the first electrodes 16 is designated as "g1", then it is necessary that the following inequality (1-1) is satisfied in order that the two adjacent first electrodes 16 are kept apart from each other for a suitable interval.

$$g1 > 2t + 2s \qquad (1\text{-}1)$$

Furthermore, the distance between the central points of the adjacent first electrodes 16 is designated as "p1", and the width of each of the first electrodes 16 is designated as "La" (The width La is defined in a direction parallel to a side of the first semiconductor chip 12 along which the first electrodes 16 are disposed.), then it is necessary that the following inequality (1-2) is satisfied in order that the two adjacent first electrodes 16 are kept apart from each other for a suitable interval.

$$p1 > La + g1 \qquad (1\text{-}2)$$

Furthermore, in the first preferred embodiment, the second electrodes 17 may be formed on the more central region of the second semiconductor chip 14 so that the length of the metallic wire 18 can be within the range from approximately 0.8 mm to 1.0 mm. When the second electrodes 17 are disposed on the second semiconductor chip 14 in this manner, the metallic wire 18 can not be bent more than necessary on the occasion when the second electrode 17 of the second semiconductor chip 14 is connected with the first electrode 16 of the first semiconductor chip 12 by the metallic wire 18.

According to the first preferred embodiment, since a metallic plated layer is formed on the first electrode of the first semiconductor chip, the connecting impact generated when the metallic wire is connected with the first electrode of the first semiconductor chip after the metallic wire is connected with the second electrode of the second semiconductor chip which is mounted on the first semiconductor chip can be absorbed by the metallic plated layer.

Also, since a metallic plated layer, instead of an aurous stud bump, is formed on the first electrode of the first semiconductor chip or since an upper metallic plated layer including aurum is deposited as thin as possible, the overall materials cost in manufacturing the semiconductor device can be significantly reduced.

Furthermore, as metallic plated layers are formed on each the first electrodes on the first semiconductor chip in a lump by the electroless plating, the time for manufacturing the semiconductor device can be reduced.

Second Preferred Embodiment

Figure 4:
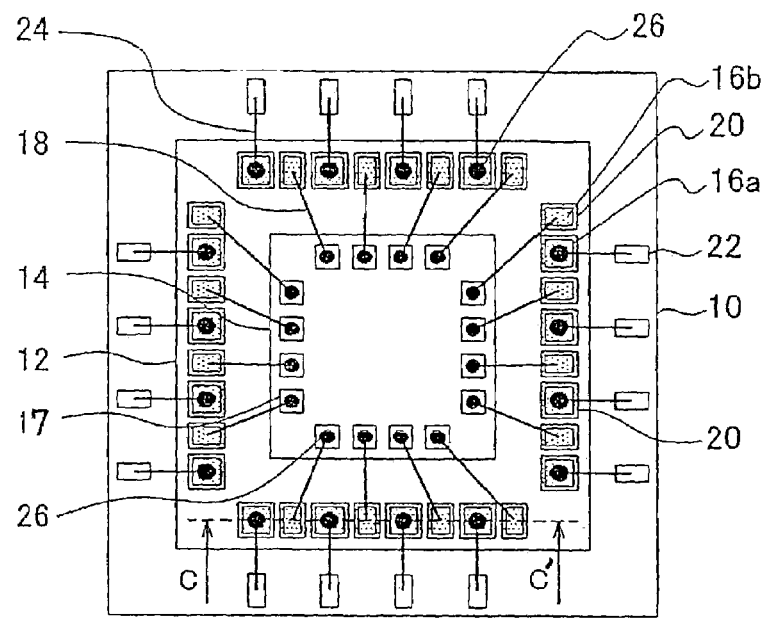
FIG. 4 is a plane view describing a semiconductor device according to a second preferred embodiment.
Figure 5:
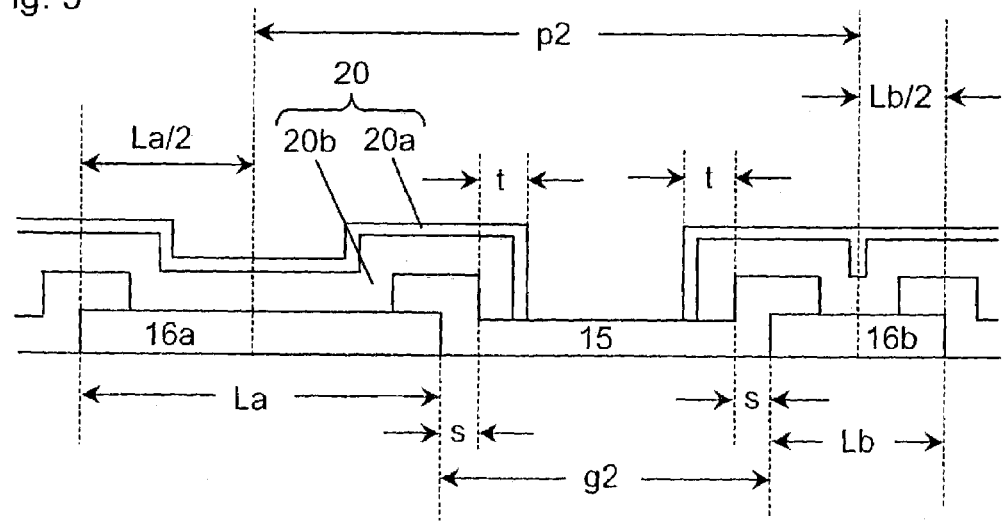
FIG. 5 is a cross-sectional view of the semiconductor device taken along line C-C' of the semiconductor device in FIG. 4.

FIG. 4 is a plane view describing a semiconductor device according to a second preferred embodiment. FIG. 5 is a cross-sectional view of the semiconductor device taken along line C-C' of the semiconductor device in FIG. 4.

In the semiconductor device of the second embodiment, the shapes of the first electrodes 16 of the first semiconductor chip 12 are different from those of the above first preferred embodiment, and the elements other than the first electrodes 16 are the same as those in the first preferred embodiment.

The first electrodes 16 of the first semiconductor chip 12 in the second preferred embodiment include wide electrodes 16a and narrow electrodes 16b which are different from each other in area, and the wide and narrow electrodes 16a and 16b are alternately disposed on a periphery of the first semiconductor chip 12.

In the second preferred embodiment, as well as in the first preferred embodiment, the metallic plated layers 20 are formed on the wide and narrow electrodes 16a and 16b, the metallic plated layer 20 comprises the upper metallic plated layer 20a and the metallic plated layer 20b, the upper metallic plated layer 20a includes aurum, and the lower metallic plated layer 20b includes nickel. Besides, in the second preferred embodiment, the metallic plated layers 20 (the upper metallic plated layer 20a and the lower metallic plated layer 20b) are formed in a manner similar to the above first preferred embodiment. The wide electrode 16a is connected with the conductive pattern 22 formed on the printed circuit board 10 by the metallic wire 24. On the other hand, the narrow electrode 16b is connected with the second electrode 17 of the second semiconductor chip 14 mounted on the first semiconductor chip 12 by the metallic wire 18.

The wide and narrow electrodes 16a and 16b have first and second widths La and Lb respectively. These widths La and Lb are defined in a direction parallel to a side of the first semiconductor chip 12 along which the wide and narrow electrodes 16a and 16b are disposed. Each of the first widths La of the wide electrodes 16a is approximately 80 μm-100 μm and is the approximately same as a diameter of the metallic ball of the metallic wire 24. Each of the second widths Lb of the narrow electrodes 16b is approximately 50 μm-60 μm and is the same as approximately twice a diameter of the metallic wire 18.

The condition of the interval between the wide electrode 16a and the narrow electrode 16b in the second preferred embodiment is stated below. FIG. 5 is a cross sectional view of the wide electrodes 16a and the narrow electrodes 16b adjacent to each other of the first semiconductor chip 12 taken along line C-C' in FIG. 4. As can be seen in this cross sectional view, the passivation layer 15 are formed on the first semiconductor chip 12 so that a portion and a side surface of the first electrode 16 can be covered. Also, the upper and lower metallic plated layer 20a and 20b are formed on the first electrode 16 so that both upper and side surfaces of the first electrode 16 can be covered. Therefore, two adjacent wide and narrow electrodes 16a and 16b must be disposed on the semiconductor chip 12 so that the metallic plated layers 20 on the adjacent wide and narrow electrodes 16a and 16b can't contact with each other. Hereupon, the thickness of the metallic plated layer 20 is designated as "t", the thickness of the passivation layer 15 is designated as "s", and the interval between the two adjacent wide and narrow electrodes 16a and 16b is designated as "g2", then it is necessary that the following inequality (2-1) is satisfied in order that the two adjacent first electrodes 16 are kept apart from each other for a suitable interval.

$$g2 > 2t + 2s \qquad (2\text{-}1)$$

Furthermore, the distance between the central points of the adjacent wide and narrow electrodes 16a and 16b is designated as "p2", then it is necessary that the following inequality (2-2) is satisfied in order that the two adjacent first electrodes 16 are kept apart from each other for a suitable interval.

$$p2 > (La + Lb)/2 + g2 \qquad (2\text{-}2)$$

Furthermore, in the second preferred embodiment, the second electrodes 17 may be formed on the more central region of the second semiconductor chip 14 so that the length of the metallic wire 18 can be within the range from approximately 0.8 mm to 1.0 mm. When the second electrodes 17 are disposed on the second semiconductor chip 14 in this manner, the metallic wire 18 can not be bent more than necessary on the occasion when the second electrode 17 is connected with the narrow electrode 16b of the first semiconductor chip 12 by the metallic wire 18.

According to the second preferred embodiment, in addition to the above advantageous effects in the first preferred embodiment, the following effects can be achieved. That is, with respect to the wide and narrow electrodes formed on the first semiconductor chip, since the width of the narrow electrode which is connected with the second electrode of the second semiconductor chip is smaller than the width of the wide electrode which is connected with the conductive pattern of the printed circuit board, it can be realized that the first electrodes are disposed on the periphery of the first semiconductor chip so as not to be electrically connected with each other if the metallic plated layers are formed on the wide and narrow electrodes.

Also, since the distance between the adjacent first electrodes of the first semiconductor chip in the second preferred embodiment is shorter than the distance between the first electrodes of the first semiconductor chip in the first preferred embodiment, it is realized that more first electrodes can be formed on the periphery of the first semiconductor chip. For example, on one side of the periphery of the first semiconductor chip, the number of the first electrodes in the second preferred embodiment is greater than the number of the first electrodes in the second preferred embodiment. As the result, since the first electrodes are formed on the first semiconductor chip in a very dense state, the highly functional semiconductor device can be realized.

Third Preferred Embodiment

Figure 6A:
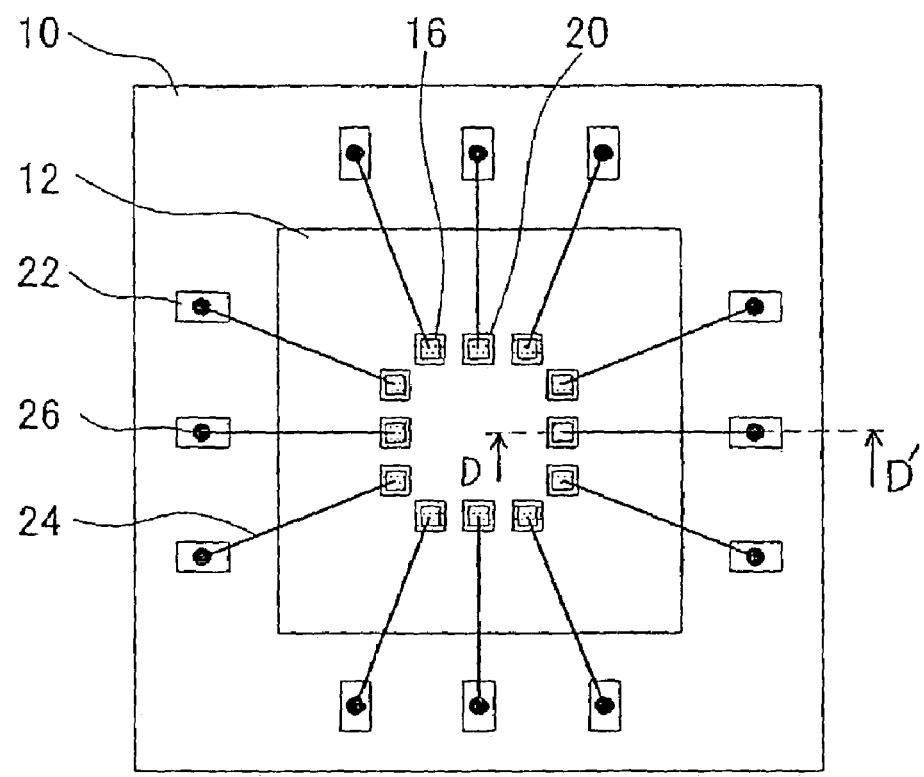
FIG. 6A is a plane view describing a semiconductor device according to a third preferred embodiment.
Figure 6B:
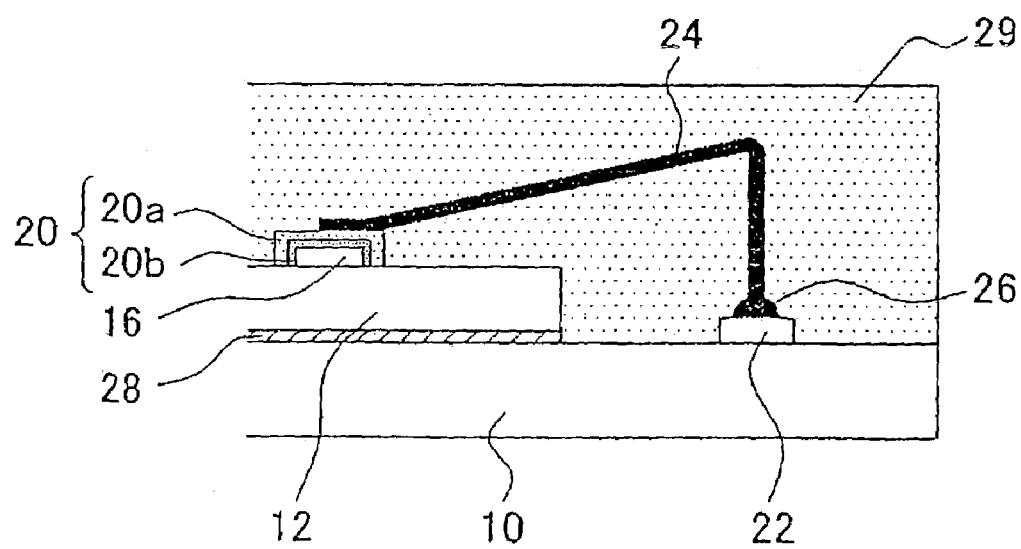
FIG. 6B is a cross-sectional view of the semiconductor device taken along line D-D' of the semiconductor device in FIG. 6A.

FIG. 6A is a plane view describing a semiconductor device according to a third preferred embodiment. FIG. 6B is a cross-sectional view of the semiconductor device taken along line D-D' of the semiconductor device in FIG. 6A.

As shown in FIG. 6A, a semiconductor chip 12 is mounted on a printed circuit board 10 by an adhesive layer 28. A plurality of conductive patterns 22 are formed on the periphery of the printed circuit board 10. A plurality of electrodes 16 are formed on the semiconductor chip 12. As well as stated in the first and second preferred embodiments, metallic plated layers 20 are respectively formed on the plurality of electrodes 16. The metallic plated layer 20 comprises an upper metallic plated layer 20a and a lower metallic plated layer 20b. The lower metallic plated layer 20b is formed on the electrode 16 and the upper metallic plated layer 20a is formed on the lower metallic plated layer 20b. The metallic plated layer 20 (each of the upper and lower metallic plated layers 20a and 20b) is formed by the electroless plating as well as stated in the above first and second preferred embodiments.

As shown in FIG. 6B, the conductive patterns 22 of the printed circuit board 10 and the upper metallic plated layer 20a on the electrodes 16 are electrically connected with each other by metallic wire 24. The metallic wire 24 is made of gold or a gold alloy. First of all, the metallic wire 24 is flamed off by torch at a tip of the capillary, and a metallic ball 26 is formed at a tip of the metallic wire 24. Then, metallic ball 26 of the metallic wire 24 is fed to the conductive pattern 22 of the printed circuit board 10 through a capillary by using ultrasonic wave and pressurization of the capillary. After one end portion of the metallic wire 18 is connected to the conductive pattern 22 of the printed circuit board 10 in this manner, another end portion of the metallic wire 24 is connected to the metallic plated layer 20 on the electrode 16 of the semiconductor chip 12 by moving the capillary from the conductive pattern 22 toward the electrode 16 and by using ultrasonic wave and pressurization of the capillary. The semiconductor chip 12 is sealed by a molding resin 29.

The electrodes 16 are disposed on the more central region of the semiconductor chip 12 so that the length of the metallic wire 24 can be within the range from approximately 0.8 mm to 1.0 mm.

Therefore, when the electrodes are disposed on the semiconductor chip in the above manner, the metallic wires can not be bent more than necessary on the occasion when the electrode of the semiconductor chip and the conductive pattern of the printed circuit board are connected with each other by the metallic wire. As a result, it is restrained that the metallic wires become stressed and damaged.

Fourth Preferred Embodiment

Figure 7A:
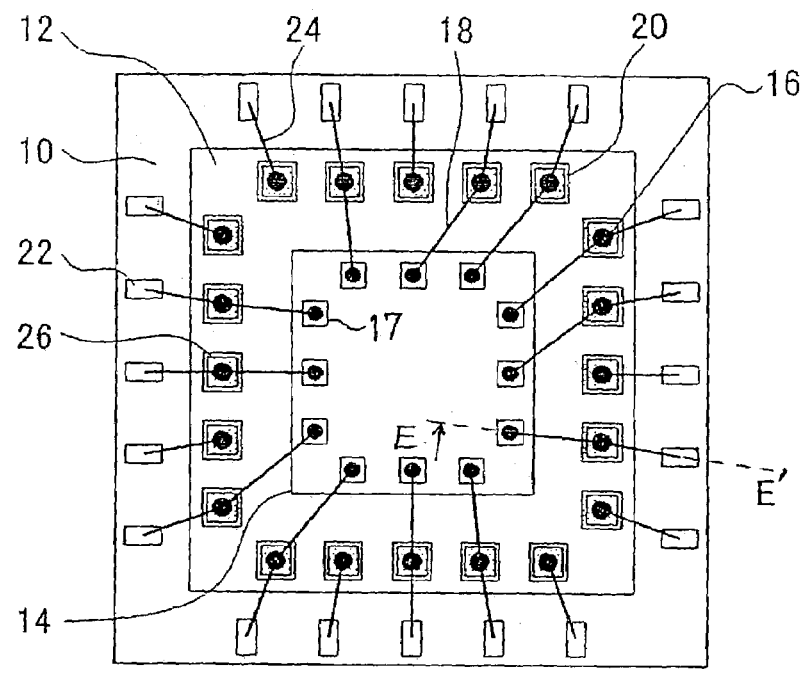
FIG. 7A is a plane view describing a semiconductor device according to a fourth preferred embodiment.
Figure 7B:
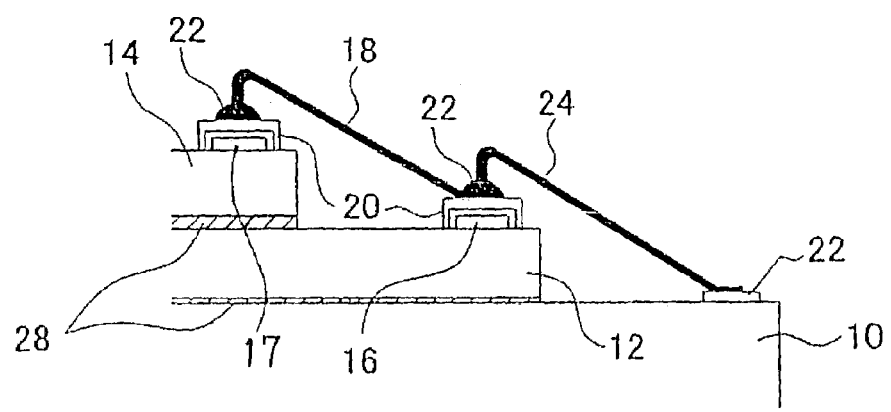
FIG. 7B is a cross-sectional view of the semiconductor device taken along line E-E' of the semiconductor device in FIG. 7A.

FIG. 7A is a plane view describing a semiconductor device according to a fourth preferred embodiment. FIG. 7B is a cross-sectional view of the semiconductor device taken along line E-E' of the semiconductor device in FIG. 7A.

A first semiconductor chip 12 is mounted on a printed circuit board 10 by an adhesive layer 27. A plurality of conductive patterns 22 are formed on a periphery of a main surface of the printed circuit board 10. A plurality of first electrodes 16 are formed on a periphery of a main surface of the first semiconductor chip 12. A circuit element is formed at the main surface of the first semiconductor chip 12. A second semiconductor chip 14 is mounted on a central region of the main surface of the first semiconductor chip 12 by an adhesive layer 28. A plurality of second electrodes 17 are formed on a periphery of a main surface of the second semiconductor chip 14. A circuit element is formed at the main surface of the second semiconductor chip 14 as well as at the first semiconductor chip 12. The first and second electrodes 16 and 17 are made of aluminum, and metallic plated layers 20 are respectively formed on the first and second electrodes 16 and 17.

The metallic plated layer 20 comprises an upper metallic plated layer 20a and a lower metallic plated layer 20b as shown in FIG. 7B. The lower plated layer 20b includes nickel and is formed on the first electrode 16 of the first semiconductor chip 12. The upper metallic plated layer 20a includes aurum and is formed on the lower plated layer 20b. Both the upper and lower metallic plated layers 20a and 20b are formed by electroless plating as well as in the first to third preferred embodiment. In addition, a passivation layer (not shown in FIGS. 7A and 7B) is formed on the main surface of each of the first and second semiconductor chip 12 and 14 so as to expose the first and second electrodes 16 and 17.

The first electrodes 16 of the first semiconductor chip 12 are respectively connected not only with the conductive patterns 22 of the printed circuit board 10 by metallic wires 24 but also with the second electrodes 17 of the second semiconductor chip 14 by metallic wires 18. After the first electrodes 16 are connected with the conductive patterns 22 and the second electrodes 17, the first and second semiconductor chips are sealed by a molding resin on the printed circuit board 10. A plurality of solder balls (not shown in FIGS. 7A and 7B) are formed on a back surface of the printed circuit board 10 and connected with the conductive patterns 22 via conductive material provided in the through holes which is formed in the printed circuit board 10.

In this fourth preferred embodiment, the metallic plated layers 20 are formed on the first and second electrodes 16 and 17. Also, the connection between the first electrodes 16 or the second electrodes 17 and the conductive patterns 22 are performed as well as in the first preferred embodiment.

According to the fourth preferred embodiment, since the first electrodes of the first semiconductor chip are connected with both the second electrodes of the second semiconductor chip and the conductive patterns of the printed circuit board, more first electrodes can be formed on the first semiconductor chip. That is, the first electrodes are densely disposed on the main surface of the first semiconductor chip. As a result, the highly functional semiconductor device can be realized.

Fifth Preferred Embodiment

Figure 8A:
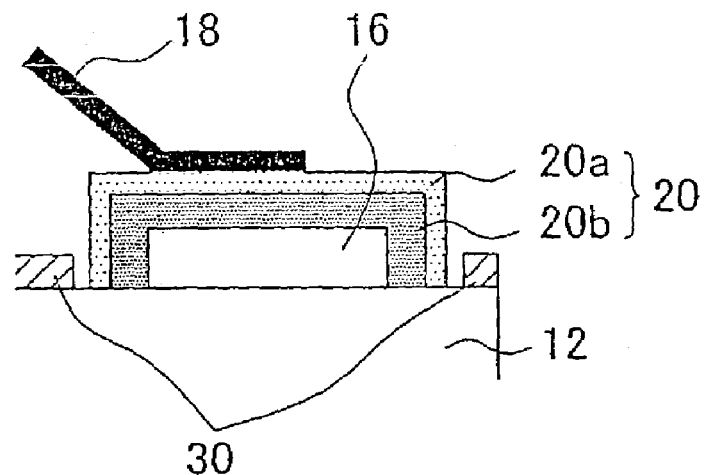
FIG. 8A is a cross-sectional view describing a electrode of a semiconductor device according to a fifth preferred embodiment.
Figure 8B:
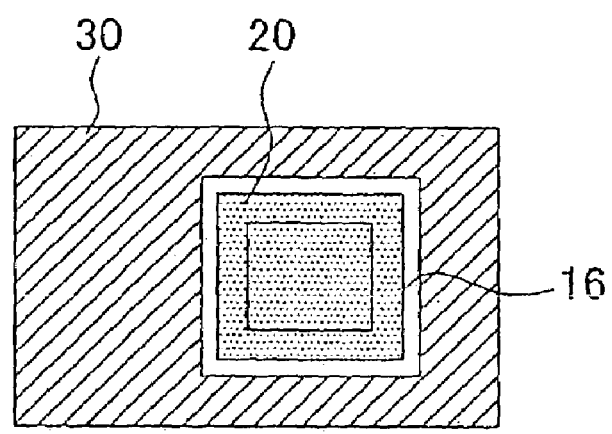
FIG. 8B is a plane view of the semiconductor device in FIG. 8A.

FIG. 8A is a cross-sectional view describing a electrode of a semiconductor device according to a fifth preferred embodiment. FIG. 8B is a plane view of the semiconductor device in FIG. 8A.

In this fifth preferred embodiment, the peripheral portion around the first electrode formed on the first semiconductor chip is different from the peripheral portion around the first electrode 16 formed on the first semiconductor chip 12 in the first preferred embodiment. Also, in this fifth preferred embodiment, a metallic plated layer is different from the metallic plated layer 20 in the first preferred embodiment. Other elements are the same as those in the first preferred embodiment.

Before the metallic plated layers 20 are formed on the first electrodes 16 of the first semiconductor chip 12, an insulating layer 30 is formed on the main surface of the first semiconductor chip 12 so that the first electrodes 16 can be exposed from the insulating layer 30 and so that a distance between the end portion of the first electrode 16 and the end portion of the insulating layer 30 can be no more than the range approximately from 45 μm to 46 μm. That is, the main surfaces of the first semiconductor chip 12 are exposed between the first electrodes 16 and the insulating layer 30. For example, the insulating layer 30 comprises silicon nitride layer.

After the above insulating layer 30 is formed on the main surface of the first semiconductor chip 12, the metallic plated layer 20 is formed on the electrodes 16 of the first semiconductor chip 12. The metallic plated layer 20 comprises an upper metallic plated layer 20a which includes aurum and a lower metallic plated layer 20b which includes nickel and is formed by the electroless plating as stated below.

The lower metallic plated layer 20b is formed on the first electrode 16 so as to cover upper and side surfaces of the first electrode 16. The thickness of the lower metallic plated layer 20b ranges approximately from 5 μm to 6 μm. The upper metallic plated layer 20a is formed on the lower metallic plated layer 20b so as to cover upper and side surfaces of the lower metallic plated layer 20b. The thickness of the upper metallic plated layer 20a ranges approximately from 0.05 μm to 0.1 μm. Therefore, the distance between the end portion of the first electrode 16 and the side surface of the upper metallic plated layer 20a becomes no more than approximately 40 μm. That is, the insulating layer 30 is formed on the main surface of the first semiconductor chip 12 so that the melted metallic wire 18 can not be in contact with the main surface of the first semiconductor chip 12 when the metallic wire 18 is connected with the metallic plated layer 20.

The dimensions of the first electrode 16 is decided so that the metallic ball of the metallic wire 24 which connects the first electrode 16 of the first semiconductor chip 12 with the conductive patterns 22 of the printed circuit board 10 can be properly set on the metallic plated layer 20 formed on the first electrode 16. Or again, the dimensions of the first electrode 16 is decided so that the stitch of the metallic wire 18 which connects the second electrode 17 of the second semiconductor chip 14 with the first electrode 16 of the first semiconductor chip 12 can be properly set on the metallic plated layer 20 formed on the first electrode 16. For example, the dimensions of the first electrode 16 is designed so as to be the same as a twice diameter of the metallic wire 18.

According to the fifth preferred embodiment, since the insulating layer is formed on the main surface of the first semiconductor chip, it is prevented that any adjacent first electrodes of the first semiconductor chip on which the metallic plated layer is formed are electrically connected with each other and it is realized that the first electrodes formed on the first semiconductor chip can be disposed closer to each other. Therefore, since the first electrodes are densely disposed on the main surface of the first semiconductor chip, the highly functional semiconductor device can be realized.

Sixth Preferred Embodiment

Figure 9:
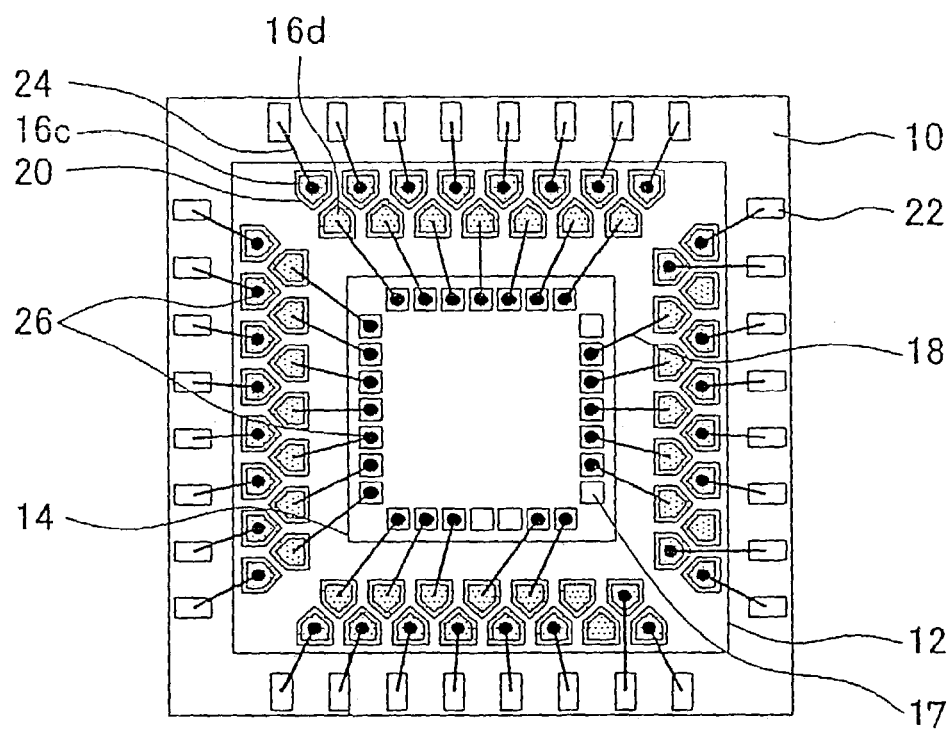
FIG. 9 is a plane view describing a semiconductor device according to a sixth preferred embodiment.
Figure 10A:
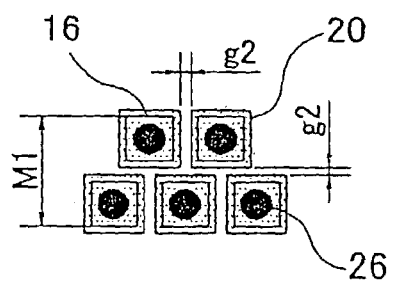
FIGS. 10A and 10B are plane views describing a comparison by the difference of the shape of the electrode on the first semiconductor chip in FIG. 9.
Figure 10B:
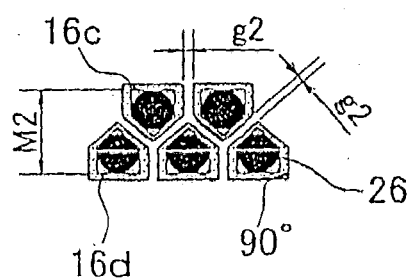

FIG. 9 is a plane view describing a semiconductor device according to a sixth preferred embodiment. FIGS. 10A and 10B are plane views describing a comparison by the difference of the shape of the electrode on the first semiconductor chip in FIG. 9.

In this sixth preferred embodiment, the arrangement or the shape of the electrode formed on the first semiconductor chip is different from that of the first electrode 16 formed on the first semiconductor chip 12 in the first preferred embodiment.

In this sixth preferred embodiment, two kinds of first electrodes 16c and third electrodes 16d are formed on the periphery of the main surface of the first semiconductor chip 12. The first electrodes 16c are disposed on a periphery of the first semiconductor chip 12, and the third electrodes 16d are disposed inside the periphery on which the first electrodes 16c are disposed. Each of the first electrodes 16c and each of the third electrode 16d are alternately disposed along the side of the first semiconductor chip 12.

As can be seen in FIG. 9, the shape of the first electrode 16c is pentagonal. One apex of the pentagon of the first electrode 16c faces through the clearance between two adjacent third electrodes 16d toward the side of the first semiconductor chip 12 which is opposite to the side along which the first electrodes 16c are disposed. On the other hand, the shape of the third electrode 16d is pentagonal as well as the shape of the first electrode 16c. Likewise, one apex of the pentagon of the third electrode 16d faces through the clearance between two adjacent first electrodes 16c toward the side of the first semiconductor chip 12 along which the third electrodes 16d are disposed. As just described above, the apexes of the first and third electrodes 16c and 16d face in the opposite direction each other. Also, each of the first and third electrodes 16c and 16d has enough area to properly provide the metallic ball formed at a tip of the metallic wire on the first and third electrodes 16c and 16d.

Some of the first electrodes 16c are electrically connected with the conductive patterns 22 of the printed circuit board 10 by the metallic wires 24. Some of the third electrodes 16d are electrically connected with the second electrodes 17 of the second semiconductor chip 14 by the metallic wires 18, and others are electrically connected with the conductive patterns 22 of the printed circuit board 10 by the metallic wires 24. The connecting process by metallic wires 18 or 24 is performed in this sixth preferred embodiment as well as in the first preferred embodiment.

On the first and third electrodes 16c and 16d, metallic plated layers 20 are formed so as to cover the first and third electrodes 16c and 16d. The metallic plated layer 20 comprises an upper metallic plated layer 20a and a lower metallic plated layer 20b. The lower metallic plated layer 20b includes nickel and is formed on the electrode 16 of the first semiconductor chip 12 so as to cover an upper surface of the electrode 16. The upper metallic plated layer 20a includes aurum and is formed on the lower metallic plated layer 20b so as to cover an upper surface of the lower metallic plated layer 20b. Both the upper and lower metallic plated layers 20a and 20b are formed by electroless plating in this sixth preferred embodiment as well as in the first preferred embodiment.

According to the sixth preferred embodiment, in addition to the above advantageous effects in the first preferred embodiment, the following effects can be achieved. That is, since each of the first and third electrodes has enough area of their surfaces respectively to provide the metallic ball of the metallic wire on the first and third electrodes, the first and third electrodes formed on the first semiconductor chip can be electrically and surely connected with both the second electrodes of the second semiconductor chip and the conductive patterns of the printed circuit board by the metallic wires. Therefore, the flexibility of the connection by the metallic wires can be increased.

Next, the interval between the first electrodes 16c and the third electrodes 16d is described below in more detail.

FIG. 10A is a plane view describing an arrangement of the electrodes 16 when the electrodes 16 are formed on the first semiconductor chip 12 squarely. FIG. 10B is a plane view describing an arrangement of the first electrodes 16c and the third electrodes 16d are formed on the first semiconductor chip 12 in pentagons.

When the electrodes 16 are formed on the first semiconductor chip 12 squarely as shown in FIG. 10A, the interval between the adjacent metallic plated layers 20 formed on the electrodes 16 is designated as "g2" and the width of an arrangement region of the electrodes 16 is designated as "M1". On the other hand, in the sixth preferred embodiment as shown in FIG. 10B, the first electrodes 16c and the third electrodes 16d are formed on the first semiconductor chip 12 in pentagons so that each of intervals between the adjacent metallic plated layers 20 formed on the first and third electrodes 16c and 16d can be "g2" as well as in FIG. 10A. By disposing the first and third electrodes 16c and 16d on the first semiconductor chip 12 in this manner, the width of an arrangement region of the electrodes 16, designated as "M2" as shown in FIG. 10A, can be decreased compared to the width "M1" as shown in FIG. 10A.

According to the sixth preferred embodiment, since the first and third electrodes of the first semiconductor chip can be disposed in the less area, the highly functional semiconductor device can be realized.

Seventh Preferred Embodiment

Figure 11:
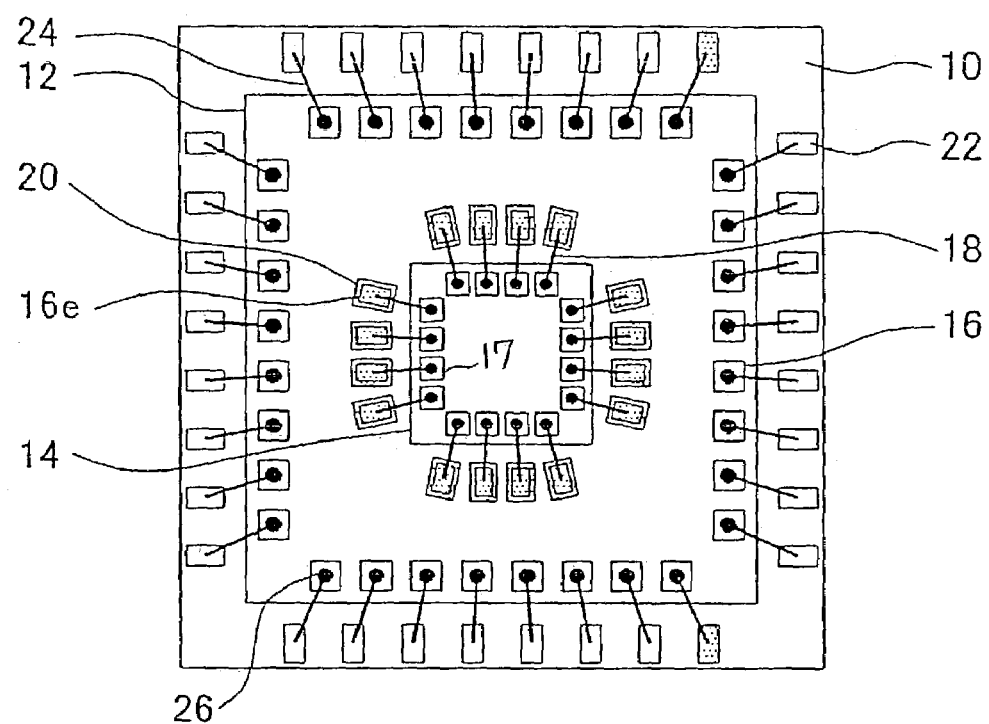
FIG. 11 is a plane view describing a semiconductor device according to a seventh preferred embodiment.

FIG. 11 is a plane view describing a semiconductor device according to a seventh preferred embodiment.

The semiconductor device in the seventh preferred embodiment is different from the semiconductor device in the first preferred embodiment mainly in that a plurality of third electrodes 16e which are electrically connected with the second electrodes 17 of the second semiconductor chip 14 are disposed on the first semiconductor chip 12 and by the side of the second semiconductor chip 14. That is, the first electrodes 16 by the side of the first semiconductor chip 12 are electrically connected with the conductive patterns 22 of the printed circuit board 10 by the metallic wires 24, and the third electrodes 16e by the side of the second semiconductor chip 14 are electrically connected with the second electrodes 17 of the second semiconductor chip 14 by the metallic wires 18. Other elements are the same as those in the first preferred embodiment. Also, the metallic plated layers 20 are formed on the third electrodes 16e and are not formed on the first electrodes 16. The metallic plated layer 20 is formed the third electrode 16e in a similar way in the first preferred embodiment.

In addition, in the seventh preferred embodiment, the third electrodes 16e are disposed near the second semiconductor chip 14 so that the length of the metallic wire 18 can be within the range from approximately 0.8 mm to 1.0 mm. In other words, for example, the third electrodes 16e are disposed on the first semiconductor chip 12 so that the interval between the second semiconductor chip 14 and the third electrode 16e can be within the range from approximately 0.65 mm to 1.15 mm.

According to the seventh preferred embodiment, since the third electrodes to be electrically connected with the second electrodes of the second semiconductor chip is disposed by the side of the second semiconductor chip, the metallic wires can be more shortened as much as possible. Therefore, when the first and second semiconductor chips are sealed by a molding resin, it is prevented that the adjacent metallic wires short out by a flow of the molding resin.

Furthermore, since the metallic plated layers are not formed on the first electrodes to be electrically connected with the conductive patterns, more first electrodes are disposed on the first semiconductor chip by just that much and without regard for the short of the adjacent first electrodes. As a result, since the first electrodes are densely disposed on the first semiconductor chip, the highly functional semiconductor device can be realized.

A method of manufacturing the semiconductor device described in the seventh preferred embodiment, will be shown hereinafter referring to FIG. 12A-FIG. 12C. FIG. 12D is a cross-sectional view describing the third electrodes 16e on which the metallic plated layers 20 are formed.

Figure 12A:
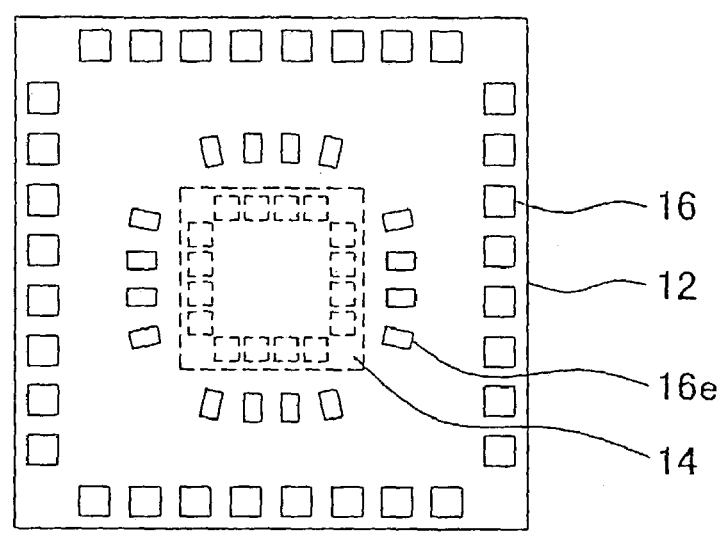
FIG. 12A-FIG. 12C are plane views describing a method of manufacturing the semiconductor device according to the seventh preferred embodiment.

As can be seen in FIG. 12A, the first electrodes 16 and the third electrodes 16e are formed on the first semiconductor chip 12. Hereupon, the first electrodes 16 are disposed on the periphery of the first semiconductor chip 12, and the third electrodes 16e are disposed around the area on which the second semiconductor chip 14 is mounted.

Figure 12B:
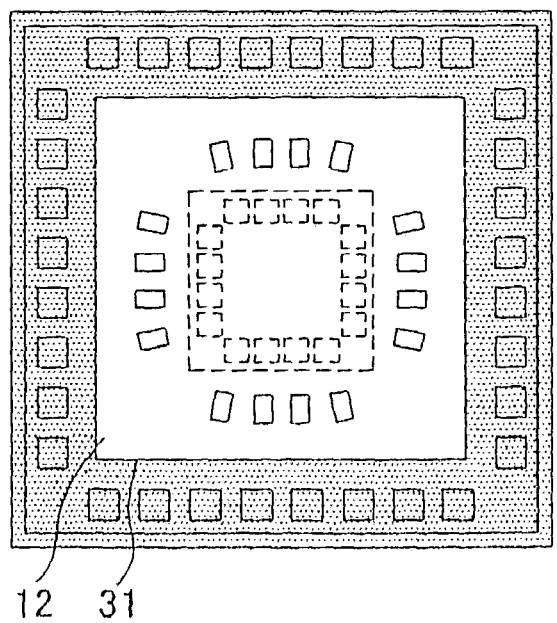
Figure 12C:
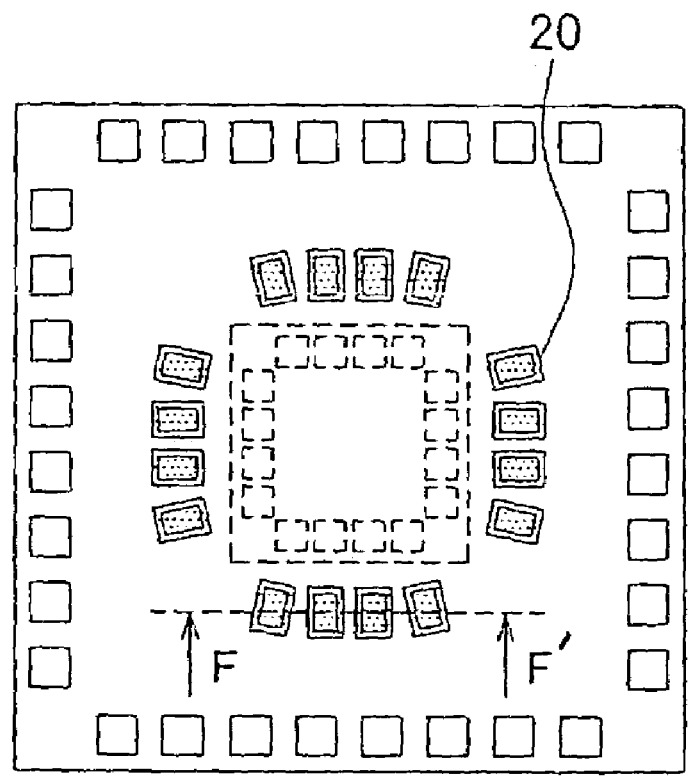
Figure 12D:
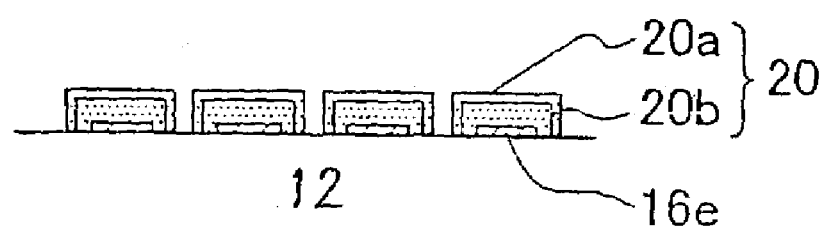
FIG. 12D is a cross-sectional view describing the third electrodes on which the metallic plated layers are formed according to the seventh preferred embodiment.

Next, as can be seen in FIG. 12B, the main surface of the first semiconductor chip 12 is covered by a mask 31 to form the metallic plated layers 20 except for the surfaces of the third electrodes 16e. After that, as can be seen in FIG. 12C, the metallic plated layers 20 are formed on the third electrodes 16e by forming the lower metallic plated layer 20b and the upper metallic plated layer 20a on the third electrodes 16e sequentially. The metallic plated layers 20 are formed in this embodiment as well as in the first preferred embodiment. Hereupon, as can be seen in FIG. 12D, it is necessary that the third electrodes 16e are kept away from each other and disposed on the first semiconductor chip 12 at desired intervals so the adjacent metallic plated layers 20 formed on the third electrodes 16e can not be connected with each other.

After forming the metallic plated layer 20, the second semiconductor chip 14 is mounted on the first semiconductor chip 12, and the connection between the first electrodes 16 and the conductive patterns 22 and the connection between the second electrodes 17 and the third electrodes 16e are performed in a similar way in the first preferred embodiment.

According to the above method of the semiconductor device by using the mask which covers the first electrodes and exposes the third electrodes, the metallic plated layers 20 can be selectively and effectively formed on the third electrodes of the first semiconductor chip.

Eighth Preferred Embodiment

Figure 13A:
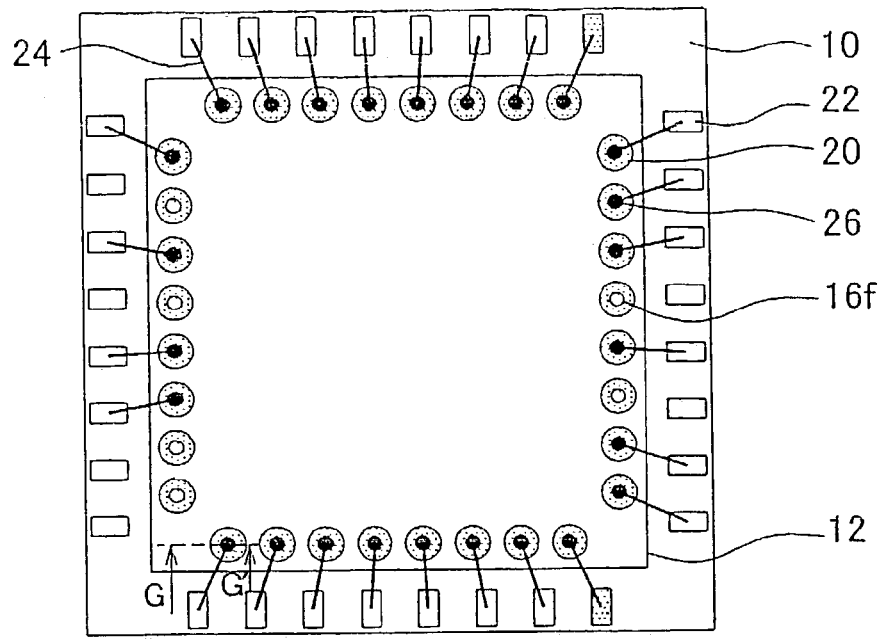
FIG. 13A is a plane view describing a semiconductor device with a plurality of first electrodes according to a eighth preferred embodiment.
Figure 13B:
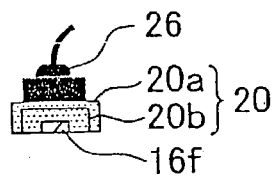
FIG. 13B is a cross-sectional view of the first electrode taken along line G-G' of the semiconductor device in FIG. 13A.
Figure 13C:
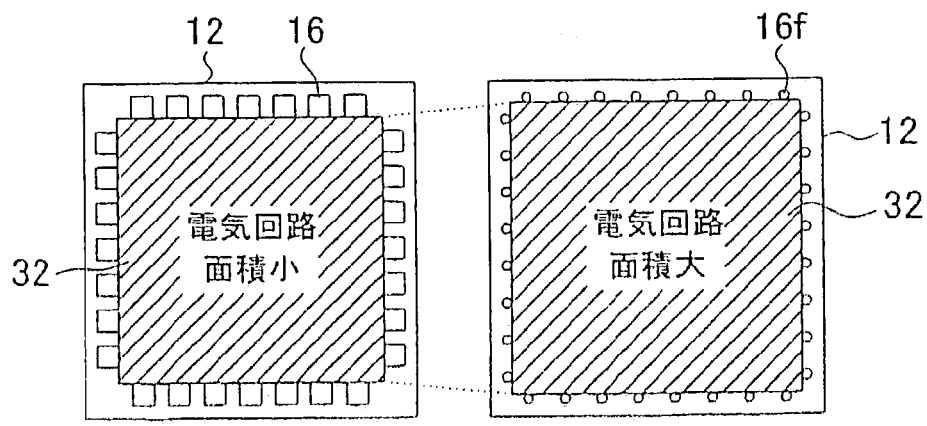
FIG. 13C is a plane view describing a comparison by the difference of the sizes of the first electrodes on the first semiconductor chip according to the eighth embodiment.

FIG. 13A is a plane view describing a semiconductor device with a plurality of first electrodes according to a eighth preferred embodiment. FIG. 13B is a cross-sectional view of the first electrode taken along line G-G' of the semiconductor device in FIG. 13A. FIG. 13C is a plane view describing a comparison by the difference of the sizes of the first electrodes on the first semiconductor chip.

In this eighth embodiment, the sizes of the first electrodes formed on the first semiconductor chip 12 are mainly different from the sizes of the first electrodes 16 formed on the first semiconductor chip 12 in the first preferred embodiment. As not shown in FIG. 13A, in this eighth embodiment, a second semiconductor chip may be mounted on the first semiconductor chip 12 as well as in the first preferred embodiment. Other elements are the substantially same as those in the first preferred embodiment.

In this embodiment, as can be seen in FIG. 13A, a circuit element 32 is formed at the main surface of the first semiconductor chip 12. A plurality of first electrodes 16f are formed on a periphery of the first semiconductor chip 12 so that the first electrodes 16f can surround a region of the circuit element 32. The circuit element 32 is an electrically active circuit other than the first electrodes 16f. Each of the first electrodes 16f is circularized and has a diameter which ranges approximately 50 µm-60 µm. Or again, each of the first electrodes 16f may be squared approximately from 50 µm to 60 µm on a side.

As shown in FIG. 13B, metallic plated layers 20 are formed on the first electrodes 16f. The metallic plated layer 20 comprises an upper metallic plated layer 20a and a lower metallic plated layer 20b. The lower metallic plated layer 20b includes nickel and is formed on the first electrode 16f of the first semiconductor chip 12 so as to cover upper and side surfaces of the first electrode 16f. The upper metallic plated layer 20a includes aurum and is formed on the lower metallic plated layer 20b so as to cover upper and side surfaces of the lower metallic plated layer 20b. Both the upper and lower metallic plated layers 20a and 20b are formed by electroless plating. And hereupon, the thickness of the lower metallic plated layer 20b ranges approximately from 20 µm to 30 µm and the thickness of the upper metallic plated layer 20a ranges approximately from 0.05 µm to 0.1 µm. Therefore, the diameter of the metallic plated layer 20 which covers the first electrodes 16f ranges approximately from 70 µm to 80 µm.

After the metallic ball 26 of the metallic wire 24 is provided onto the metallic plated layer 20, the first electrode 16f on which the metallic plated layer 20 is formed is electrically connected with the conductive pattern 22 by the metallic wire 24 as well as in the first preferred embodiment. The metallic ball 26 has a diameter which ranges approximately 70 µm to 80 µm. That is, the metallic ball 26 has the substantially same diameter as the first electrode 16f on which the metallic plated layer 20 is formed.

According to the eighth embodiment, since the diameter of the first electrode ranges approximately from 50 µm to 60 µm, an area of the circuit element ban be increased as much as possible. Also, even if the diameter of the first electrode is decreased, since the metallic plated layer is formed on the upper and side surfaces of the first electrode, the area onto which the metallic ball of the metallic wire is provided is retained on the first electrode. That is, the reliability of the electrical connection between the first electrode and the conductive pattern can be kept more surely with the area of the upper surface of the first electrode decreased. Furthermore, since the diameter of the first electrode is decreased, the first electrodes are easily arranged on the first semiconductor chip. As a result, the highly functional semiconductor device can be realized.

A method of manufacturing the semiconductor device described in the eighth preferred embodiment, will be shown hereinafter referring to FIG. 14A-FIG. 14D.

Figure 14A:
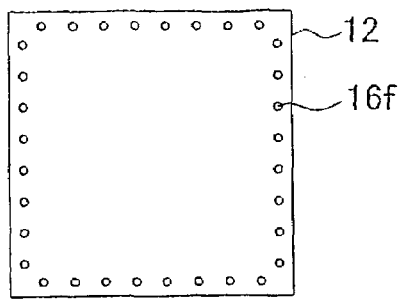
FIG. 14A-FIG. 14D are plane and cross-sectional views describing a method of manufacturing the semiconductor device according to the eighth embodiment.

As can be seen in FIG. 14A, the first electrodes 16f are formed on the periphery of the main surface of the first semiconductor chip 12. The first electrode 16f includes aluminum and is circular.

Figure 14B:
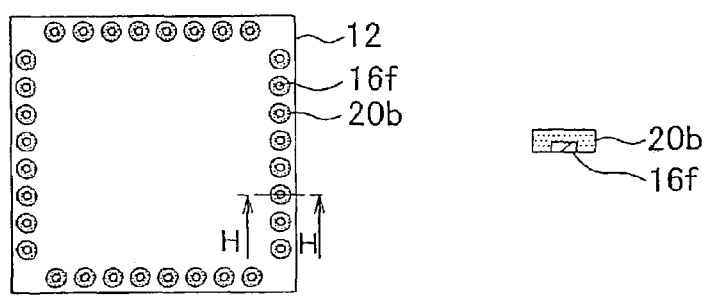

Next, as can be seen in FIG. 14B, the lower metallic plated layers 20b are formed on the first electrodes 16f in a lump by the electroless plating. The detail of the method for the lower metallic plated layer 20b described as follows. Covering oxidized layers are removed from the first electrodes 16f by a substitution method with zinc. By reducing nickel ion chemically and using hypophosphorous acid as a reductant, a nickel layer whose thickness ranges approximately from 20 µm to 30 µm is deposited on each of the first electrodes 16f. Hereupon, the lower metallic plated layer 20b can be formed on upper and side surfaces of the first electrode 16f by exploiting the nature of isotropy in the plating method and controlling the plating time. Also, the lower metallic plated layer 20b is formed on the first electrode 16f so that the adjacent first electrodes 16f can not be electrically connected as shown in a cross-sectional view of the adjacent first electrodes 16f taken along line H-H' of the semiconductor device in FIG. 14B. Thus, for example, the lower metallic plated layer 20b is formed on the upper and side surfaces of the first electrode 16f so that the diameter of the first electrode 16f on which the lower plated electrode 20b is formed can range approximately from 70 µm to 80 µm.

Figure 14C:
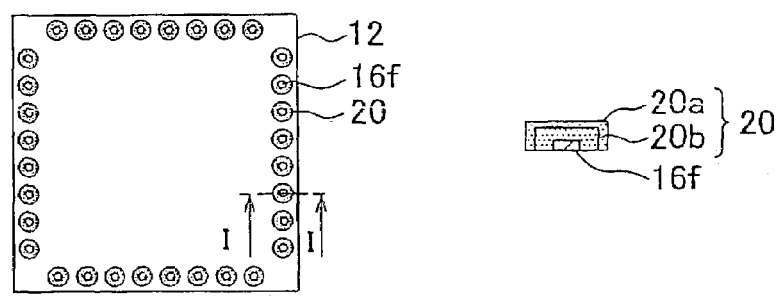

Next, as can be seen in FIG. 14C, the upper metallic plated layer 20a is formed on the lower metallic plated layer 20b by the electroless plating. The detail of the method for the upper metallic plated layer 20a described as follows. Aurum atoms are deposited on the nickel layer (the lower metallic plated layer 20b) by using boron-potassium hydroxide as a reductant. Since aurum atoms function as catalysts by itself, an aurum layer grows on the nickel layer. Thus, the upper metallic plated layers 20a whose thickness ranges approximately from 0.05 µm-0.1 µm are formed on each of the lower metallic plated layers 20b in a lump by the electroless plating. As shown in a cross-sectional view of the adjacent first electrodes 16f on which the lower metallic plated layers 20a are formed and which are taken along line I-I' of the semiconductor device in FIG. 14C, the upper and side surfaces of the lower metallic plated layer 20b are covered by the upper metallic plated layer 20a. Thus, electrodes for a next wire-bonding process are formed.

Figure 14D:
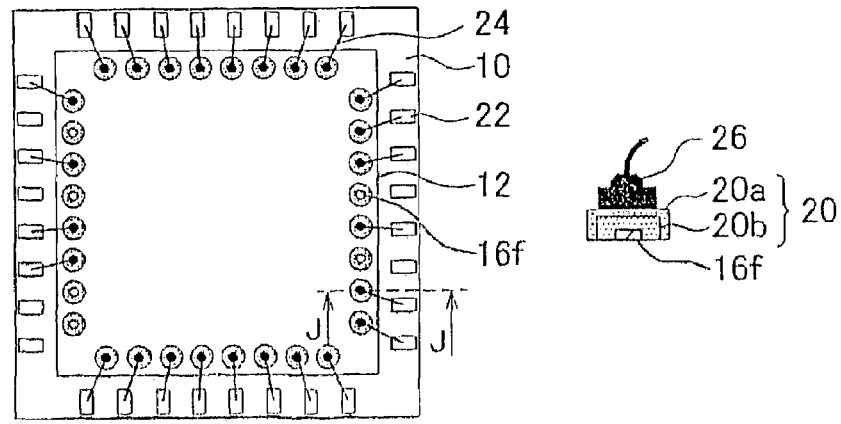

Next, as can be seen in FIG. 14D, the first electrode 16f on which the metallic plated layer 20 is formed is electrically connected with the conductive pattern 22 of the printed circuit board 10. As shown in a cross-sectional view of the adjacent first electrodes 16f on which the metallic plated layers 20 are formed and which are taken along line J-J' of the semiconductor device in FIG. 14D, the metallic balls 26 of the metallic wires 24 are respectively connected with the metallic plated layers 20 on the first electrodes 16f.

According to the eighth preferred embodiment, since the metallic plated layer are formed on the first electrodes by the electroless plating, the area of the first electrodes which are previously formed on the first semiconductor chip can be decreased.

Ninth Preferred Embodiment

Figure 15A:
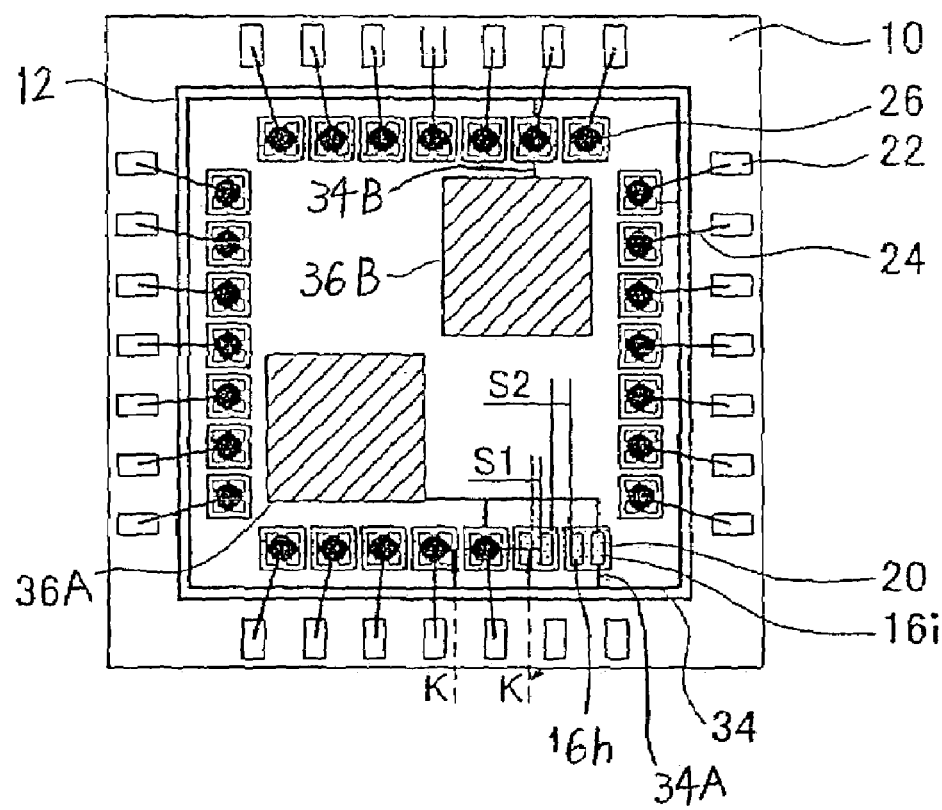
FIG. 15A is a plane view describing a semiconductor device with a plurality of electrodes according to a ninth preferred embodiment.
Figure 15B:
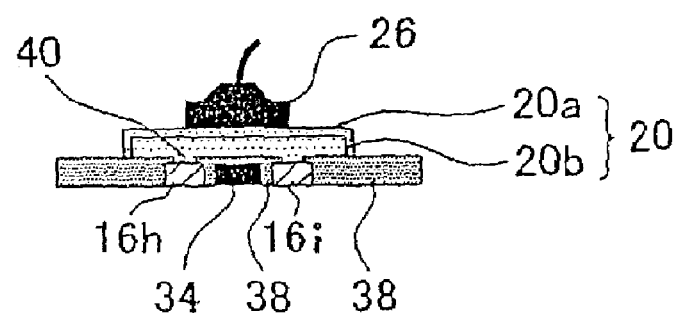
FIG. 15B is a cross-sectional view of the electrodes taken along line K-K' of the semiconductor device in FIG. 15A.

FIG. 15A is a plane view describing a semiconductor device with a plurality of electrodes according to a ninth preferred embodiment. FIG. 15B is a cross-sectional view of the electrodes taken along line K-K' of the semiconductor device in FIG. 15A.

In this ninth embodiment, the structure of the electrodes 16h and 16i formed on the periphery of the first semiconductor chip 12 are mainly different from the structure of the electrodes 16f formed on the first semiconductor chip 12 in the eighth preferred embodiment. Other elements are the substantially same as those in the eighth preferred embodiment. In this ninth embodiment, a second semiconductor chip may be mounted on the first semiconductor chip 12 as well as in the first preferred embodiment.

In this embodiment, as can be seen in FIG. 15A, a first semiconductor chip 12 is mounted on a printed circuit board 10. A plurality of conductive patterns 22 are formed on the periphery of the printed circuit board 10. A plurality of electrodes 16h and 16i are alternately disposed on the periphery of the first semiconductor chip 12. Internal circuits 36A and 36B are formed on the central region of the first semiconductor chip 12 so as to be surrounded by the electrodes 16h and 16i.

The electrodes 16h and 16i are rectangular and made of aluminum. The electrodes 16h and 16i have respectively widths which range approximately from 20 µm to 30 µm and are arranged so as to be parallel to each other. The width is defined in a direction parallel to a side of the first semiconductor chip 12 along which the electrodes 16h and 16i are formed. The electrodes 16h and 16i are disposed along the side of the first semiconductor chip 12 so that the adjacent electrodes 16h and 16i can be paired. As can be seen in FIG. 15A, in one pair of the electrodes 16h and 16i, the distance S1 between the adjacent electrodes 16h and 16i ranges approximately from 20 µm to 30 µm. The distance S2 between the electrode 16h of the one pair and the electrode 16i of another pair of the electrodes 16h and 16i ranges approximately from 50 µm to 60 µm.

As shown in FIG. 15B, on the main surface of the first semiconductor chip 12, a passivation layer 38 is formed so that an upper surface of the electrodes 16h and 16i can be exposed from the passivation layer 38. That is, the passivation layer 38 is formed on the first semiconductor chip 12 so as to cover side and a portion of surfaces of the electrodes 16h and 16i and so that openings 40 can be formed in the passivation layer 38. For example, the passivation layer 38 is made of silicon nitride. A metallic plated layer 20 is formed on the electrodes 16h, 16i and the passivation layer 38 so that the adjacent electrodes 16h and 16i are electrically connected with each other. The metallic plated layer 20 are formed to absorb the impact by the wire bonding process to the first semiconductor chip 12. The metallic plated layer 20 comprises an upper metallic plated layer 20a which includes aurum and a lower metallic plated layer 20b which includes nickel. For example, it is preferred that the thickness of the lower metallic plated layer 20b ranges approximately from 20 µm to 30 µm and thickness of the upper metallic plated layer 20a ranges approximately from 0.05 µm to 0.1 µm. Hereupon, the lower metallic plated layer 20b grows with isotropy on the electrodes 16h and 16i by the electroless plating so that the diameter of the metallic plated layer 20 can range approximately from 70 µm to 80 µm.

The electrodes 16h and 16i are electrically connected with the conductive patterns 22 by metallic wires 24. On the metallic plated layer 20, a metallic ball 26 is provided when the electrodes 16h and 16i are electrically connected with the conductive patterns 22 by the metallic wires 24. The metallic ball 26 of the metallic wire 24 is electrically connected with the electrodes 16h and 16i through the metallic plated layer 20. For example, the diameter of the metallic ball 26 ranges approximately from 70 µm to 80 µm. Another end of the metallic wire 24 is connected with the conductive pattern 22 by ultrasonic vibration and summation.

According to the ninth embodiment, since the lower metallic plated layer is formed on the electrodes with isotropy by the electroless plating, the area of the metallic plated layer can be enough widened to provide the metallic ball thereon. Therefore, the strength of the connection between the upper metallic plated layer and the metallic ball of the metallic wire can be surely improved. As a result, the electrical connecting reliability between the electrode of the semiconductor chip and the conductive pattern of the printed circuit board can be increased.

Furthermore, as can be seen in FIG. 15A, a peripheral wiring 34 may be formed on the periphery of the first semiconductor chip 12 to surround a plurality of the electrodes 16h and 16i. Since the distance between the adjacent electrodes 16h and 16i ranges approximately from 20 µm to 30 µm, the peripheral wiring 34 can be connected to the internal circuit 36A or 36B through the wiring 34A or 34B formed at the clearance between the adjacent electrodes 16h and 16i. Also, the peripheral wiring 34 and the wirings 34A and 34B are covered by the passivation layer 38.

According to the ninth embodiment, the power supply voltage provided from the outside of the semiconductor device to one of the electrodes can be effectively applied to the internal circuit through the peripheral wiring and the wiring. Therefore, the highly functional semiconductor device can be realized.

A method of manufacturing the semiconductor device described in the ninth preferred embodiment, will be shown hereinafter referring to FIG. 16A-FIG. 16D.

Figure 16A:
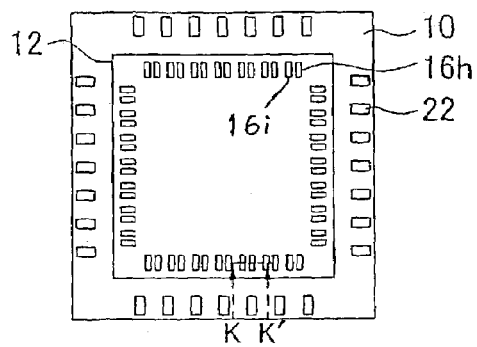
FIG. 16A-FIG. 16D are plane and cross-sectional views describing a method of manufacturing the semiconductor device according to the ninth embodiment.
Figure 16A:
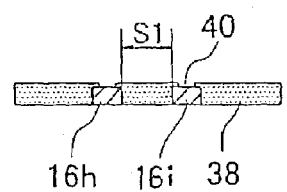

As can be seen in FIG. 16A, after preparing the printed circuit board 10 having a plurality of the conductive patterns 22 formed thereon and the first semiconductor chip 12 having a plurality of electrodes 16h and 16i formed thereon and being covered by the passivation layer 38, the first semiconductor chip 12 is mounted on the printed circuit board 10.

Figure 16B:
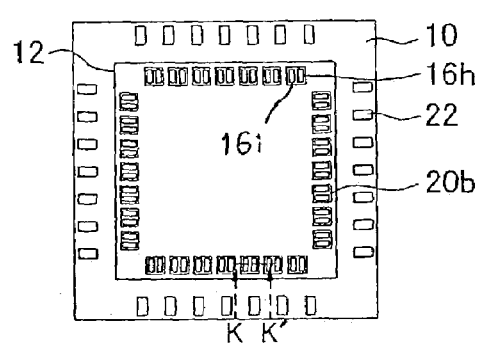
Figure 16B:
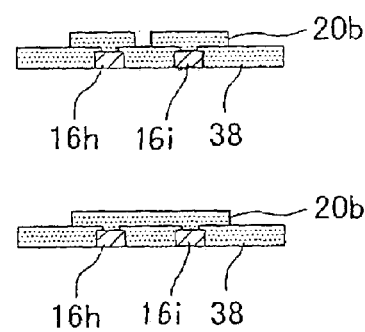

Next, as can be seen in FIG. 16B, the lower metallic plated layers 20b are formed on the electrodes 16h and 16i in a lump by the electroless plating. The detail of the method for the lower metallic plated layer 20b described as follows. Covering oxidized layers are removed from the electrodes 16h and 16i by a substitution method with zinc. By reducing nickel ion chemically and using hypophosphorous acid as a reductant, a nickel layer is deposited on each of the electrodes 16h and 16i. Then, the lower metallic plated layer 20b grows on the electrode 16h and 16i by exploiting the nature of isotropy in the plating method and controlling the plating time, and the lower metallic plated layers 20b on both the electrode 16h and electrode 16i are connected with each other. As a result, the lower metallic plated layer 20b whose thickness ranges approximately from 20 μm to 30 μm is formed on the passivation layer 38 and the electrodes 16h and 16i.

Figure 16C:
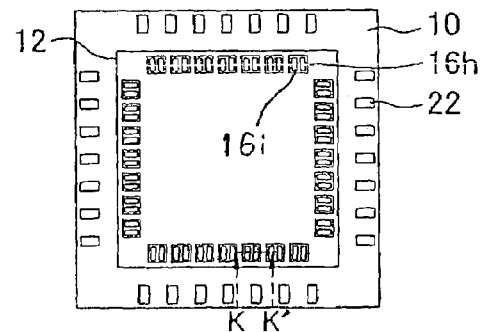
Figure 16C:
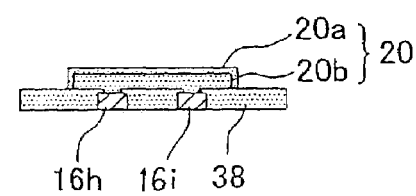

Next, as can be seen in FIG. 16C, the upper metallic plated layer 20a is formed on the lower metallic plated layer 20b by the electroless plating. The detail of the method for the upper metallic plated layer 20a described as follows. Aurum atoms are deposited on the nickel layer (the lower metallic plated layer 20b) by using boron-potassium hydroxide as a reductant. Since aurum atoms function as catalysts by itself, an aurum layer grows on the nickel layer. Thus, the upper metallic plated layers 20a whose thickness ranges approximately from 0.05 μm-0.1 μm are formed on each of the lower metallic plated layers 20b in a lump by the electroless plating.

Figure 16D:
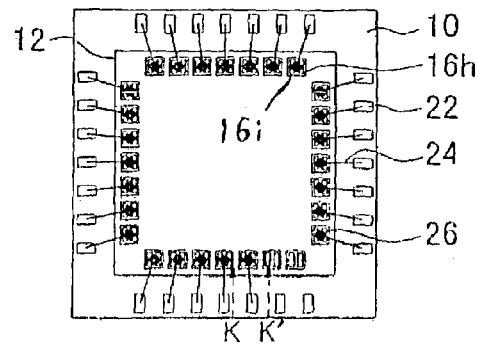
Figure 16D:
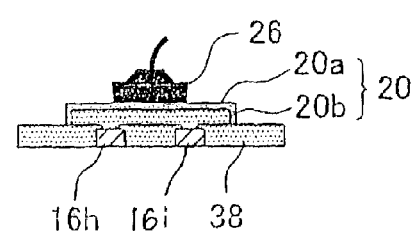

Next, As shown in a cross-sectional view of the adjacent electrodes 16h and 16i on which the metallic plated layers 20 is formed and which are taken along line K-K' of the semiconductor device in FIG. 16D, after the upper and lower metallic plated layers 20a and 20b are formed on the electrodes 16h and 16i, the metallic ball 26 of the metallic wire 24 is provided on the upper metallic plated layer 20a, and the electrodes 16h and 16i are electrically connected with the conductive pattern 22 of the printed circuit board 10.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention. For example, in the first and second preferred embodiment, the present invention may apply to the case in which three or more semiconductor chips are mounted on the printed circuit board. Moreover, in the first preferred embodiment, the present invention may apply to the case in which each of the semiconductor chips is separately mounted on the surface of the printed circuit board.

What is claimed is:

1. A semiconductor device, comprising:
   a printed circuit board having a plurality of conductive patterns;
   at least one semiconductor chip having a main surface at which a circuitry is formed, the semiconductor chip being mounted on the printed circuit board;
   a plurality of raised electrodes being formed on a periphery of the main surface of the semiconductor chip;
   metallic plated layers being formed on the electrodes of the semiconductor chip, said metallic plated layers comprising first and second metallic plated layers, wherein the first metallic plated layer is formed on the electrode of the semiconductor chip so as to cover a side surface and a top surface of the electrode, and the second metallic plated layer is formed on the first metallic plated layer so as to cover a side surface and a top surface of the first metallic plated layer, and wherein the first and second metallic plated layer is different from each other in material; and
   metallic wires which are directly connected to the second metallic plated layer on the respective electrodes, without the use of additional conductive bumps, to electrically connect the conductive patterns with the metallic plated layers on the electrodes respectively.

2. The semiconductor device according to claim 1, wherein the first metallic plated layer includes nickel and the second metallic plated layer includes aurum.

3. The semiconductor device according to claim 2, wherein a thickness of the first metallic plated layer ranges approximately from 5 μm to 6 μm.

4. The semiconductor device according to claim 3, wherein a thickness of the second metallic plated layer ranges approximately from 0.05 μm to 0.1 μm.

5. The semiconductor device according to claim 1, further comprising:
   a passivation layer being formed on the main surface of the semiconductor chip so as to expose the electrodes of the semiconductor chip; and
   an adhesive layer which connects the semiconductor chip and the printed circuit board.

6. The semiconductor device according to claim 5, wherein a distance between the passivation layer and the second metallic plated layer is less than approximately 40 μm.

7. The semiconductor device according to claim 1, further comprising:
   a plurality of solder balls being provided on a rear surface of the printed circuit board; and
   a molding resin which seals the semiconductor chip on the printed circuit board.

8. The semiconductor device according to claim 1, wherein the electrodes are arranged in a line on the main surface of the semiconductor chip, spaced away from a side of the semiconductor chip so that a length of the metallic wire can range approximately from 0.8 mm to 1.0 mm.

9. The semiconductor device according to claim 1, wherein the electrode is circular and a diameter of the electrode ranges approximately from 50 μm to 60 μm.

10. The semiconductor device according to claim 9, wherein a diameter of the metallic plated layer ranges approximately from 70 μm to 80 μm.

11. The semiconductor device according to claim 1, wherein the electrode is squared approximately from 50 μm to 60 μm.

12. The semiconductor device according to claim 11, wherein a diameter of the metallic plated layer ranges approximately from 70 μm to 80 μm.

13. The semiconductor device according to claim 1, wherein the electrode is divides into two electrodes and the metallic plated layer formed on the electrode connects the two electrodes each other.

14. The semiconductor device according to claim 13, further comprising:
   a peripheral conductive pattern being formed on the periphery of the semiconductor chip so as to surround the electrodes; and an internal circuit formed at the main surface of the semiconductor chip, wherein the internal circuit is electrically connected with the peripheral conductive pattern.

15. The semiconductor device according to claim 14, further comprising:
a connecting pattern being formed between the two electrodes, wherein the internal circuit is connected with the peripheral conductive pattern through the connecting pattern.

16. The semiconductor device according to claim 14, wherein a distance between the two electrodes ranges approximately from 20 μm to 30 μm.

17. The semiconductor device according to claim 14, wherein each of the two electrodes is rectangular.

18. The semiconductor device according to claim 1, wherein said at least one semiconductor chip is a first semiconductor chip;
further comprising a second semiconductor chip having a main surface on which a plurality of electrodes is formed, the second semiconductor chip being mounted on the main surface of the first semiconductor chip; and wherein the metallic wires electrically connect the electrodes of the second semiconductor chip with the metallic plated layers on the electrodes of the first semiconductor chip.

19. A semiconductor device, comprising:
a printed circuit board having a conductive pattern;
a semiconductor chip having a main surface at which a circuitry is formed, the semiconductor chip being mounted on the printed circuit board;
an electrode formed on a periphery of the main surface of the semiconductor chip, said electrode rising above the main surface of said semiconductor chip, so as to have a raised upper surface, and a raised side wall surface;
metallic plated layers being formed on the raised upper surface and the raised side wall surface of said electrode; and
a metallic wire which is directly connected to the metallic plated layers on the electrode, without the use of an additional conductive bump, to electrically connect the conductive pattern with the metallic plated layers on said electrode.

20. The semiconductor device according to claim 19, further comprising:
first and second metallic plated layers being included in the metallic plated layer, wherein the first metallic plated layer is formed on the electrode of the semiconductor chip and the second metallic plated layer is formed on the first metallic plated layer.

21. The semiconductor device according to claim 20, wherein the first and second metallic plated layer are different from each other in material.

22. A semiconductor device, comprising:
a printed circuit board having a conductive pattern;
a semiconductor chip having a main surface at which a circuitry is formed, the semiconductor chip being mounted on the printed circuit board;
an electrode formed on a periphery of the main surface of the semiconductor chip, a main surface of said electrode having a width;
a first metallic plated layer being formed on the main surface of said electrode, said first metallic plated layer having a width that is greater than the width of the main surface of said electrode;
a second metallic plated layer being formed on said first metallic plated layer, said second metallic plated layer having a width that is greater than the width of said first metallic plated layer; and
a metallic wire which is directly connected to the second metallic plated layer on the electrode, without the use of an additional conductive bump, to electrically connect the conductive pattern with the metallic plated layers on the electrode.

23. The semiconductor device according to claim 22, wherein the first and second metallic plated layer are different from each other in material.

24. The semiconductor device according to claim 23, wherein the first metallic plated layer includes nickel and the second metallic plated layer includes aurum.

25. The semiconductor device according to claim 24, further comprising:
first and second metallic plated layers being included in the metallic plated layer, wherein the first metallic plated layer is formed on the electrode of the semiconductor chip and the second metallic plated layer is formed on the first metallic plated layer.

26. The semiconductor device according to claim 25, wherein the first and second metallic plated layer are different from each other in material.

27. The semiconductor device according to claim 26, wherein the first metallic plated layer includes nickel and the second metallic plated layer includes aurum.

28. The semiconductor device according to claim 27, wherein a thickness of the first metallic plated layer ranges approximately from 5 μm to 6 μm.

29. The semiconductor device according to claim 28, wherein a thickness of the second metallic plated layer ranges approximately from 0.05 μm to 0.1 μm.

* * * * *